United States Patent
Yeh et al.

(10) Patent No.: US 8,334,579 B2
(45) Date of Patent: Dec. 18, 2012

(54) SCHOTTKY DIODE

(75) Inventors: Ping Chun Yeh, Taichung (TW); Der-Chyang Yeh, Hsin-Chu (TW); Chih-Ping Chao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/899,904

(22) Filed: Oct. 7, 2010

(65) Prior Publication Data

US 2012/0086099 A1    Apr. 12, 2012

(51) Int. Cl.
*H01L 29/872* (2006.01)

(52) U.S. Cl. ............. 257/475; 257/506; 257/E27.112; 257/E21.602; 257/206; 257/369; 257/476; 257/E27.016; 257/E27.024; 257/119; 257/134; 257/575; 257/557; 257/565; 257/197; 257/483; 438/134

(58) Field of Classification Search .......... 257/475, 257/369, 476, E27.016, E27.024, 438, E29.338, 257/506, 206, 575, 557, 565, 197, 483; 438/134
See application file for complete search history.

(56) References Cited

U.S. PATENT DOCUMENTS

| 6,121,122 A | 9/2000 | Dunn et al. |
|---|---|---|
| 2007/0041144 A1* | 2/2007 | Szeto et al. .................... 361/272 |
| 2009/0236679 A1* | 9/2009 | Chiang et al. ................. 257/483 |
| 2009/0283841 A1 | 11/2009 | Yeh et al. |
| 2009/0294865 A1* | 12/2009 | Tang et al. .................... 257/369 |

OTHER PUBLICATIONS

R.M. Rassel et al., "Schottky Barrier Diodes for Millimeter Wave SiGe BiCMOS Applications" IEEE BCTM 13.4, 1-4244-0459-2/06, 2006 IEEE, 4 pages.

* cited by examiner

*Primary Examiner* — Marc Armand
(74) *Attorney, Agent, or Firm* — Haynes and Boone, LLP (57) ABSTRACT

An integrated circuit device and method for fabricating the integrated circuit device is disclosed. The integrated circuit device includes a substrate, a diffusion source, and a lightly doped diffusion region in contact with a conductive layer. A junction of the lightly doped diffusion region with the conductive layer forms a Schottky region. An annealing process is performed to form the lightly doped diffusion region. The annealing process causes dopants from the diffusion source (for example, an n-well disposed in the substrate) of the integrated circuit device to diffuse into a region of the substrate, thereby forming the lightly doped diffusion region.

20 Claims, 7 Drawing Sheets

SCHOTTKY DIODE

BACKGROUND

Integrated circuit (IC) technologies are constantly being improved. Such improvements frequently involve scaling down device geometries to achieve lower fabrication costs, higher device integration density, higher speeds, and better performance. Along with the advantages from reducing geometry size, improvements are being made directly to the IC devices. One such IC device is a Schottky barrier diode, which exhibits low forward voltage drop, switching speeds that approach zero time, and particular usefulness in radio-frequency applications. The Schottky barrier diode includes a metal in contact with a semiconductor material surface. For example, a Schottky device includes a metal silicide layer in contact with a well region, such as an n-well region, of a silicon substrate to form the Schottky contact region. As the doping concentration of the n-well region increases, the doping at the junction of the metal silicide layer/n-well region increases, thus leading to lower breakdown voltages and higher leakage currents than desired. Accordingly, although existing Schottky devices and methods of fabricating Schottky devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
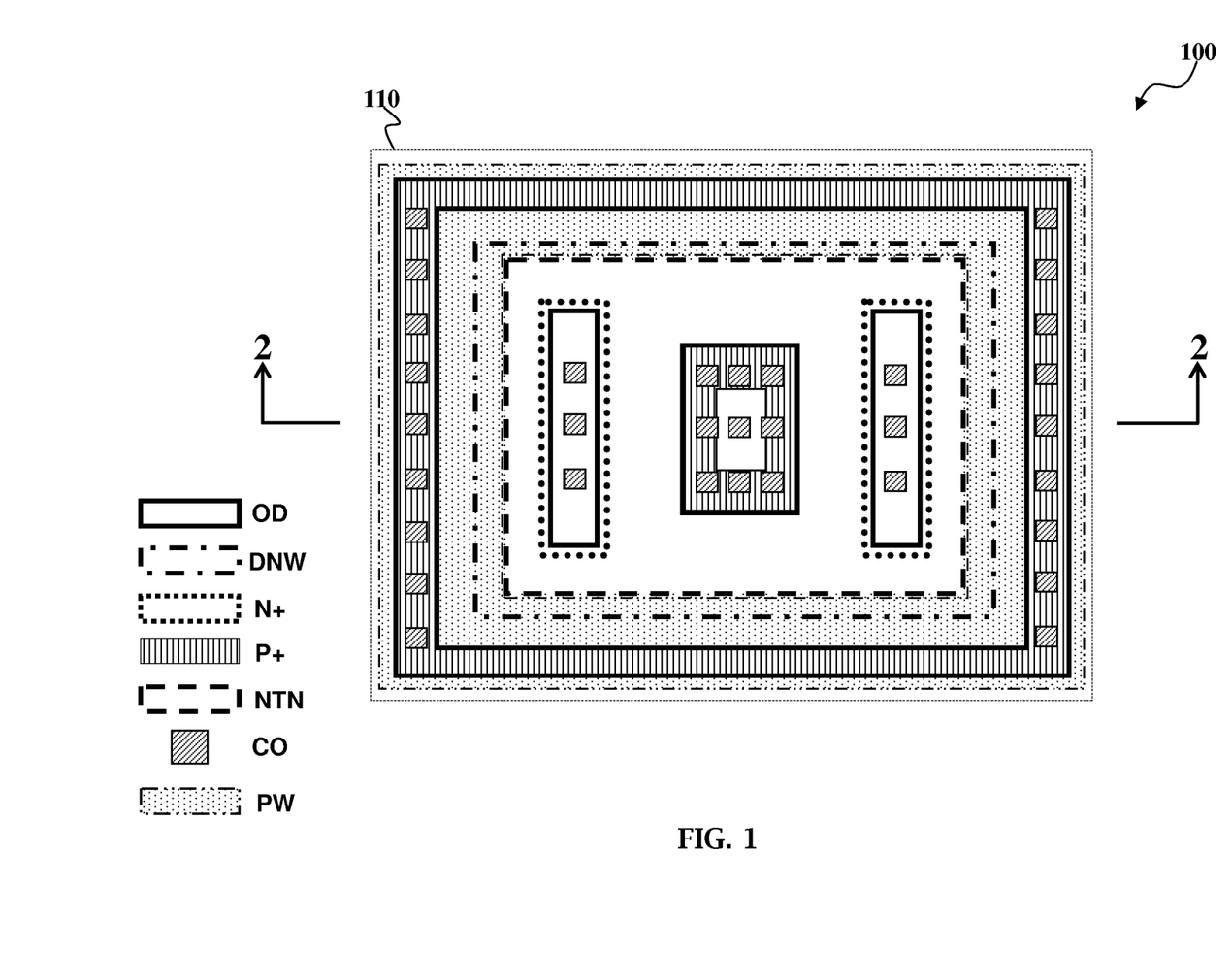
FIG. 1 is a diagrammatic top view of an embodiment of an integrated circuit device according to various aspects of the present disclosure.
Figure 2:
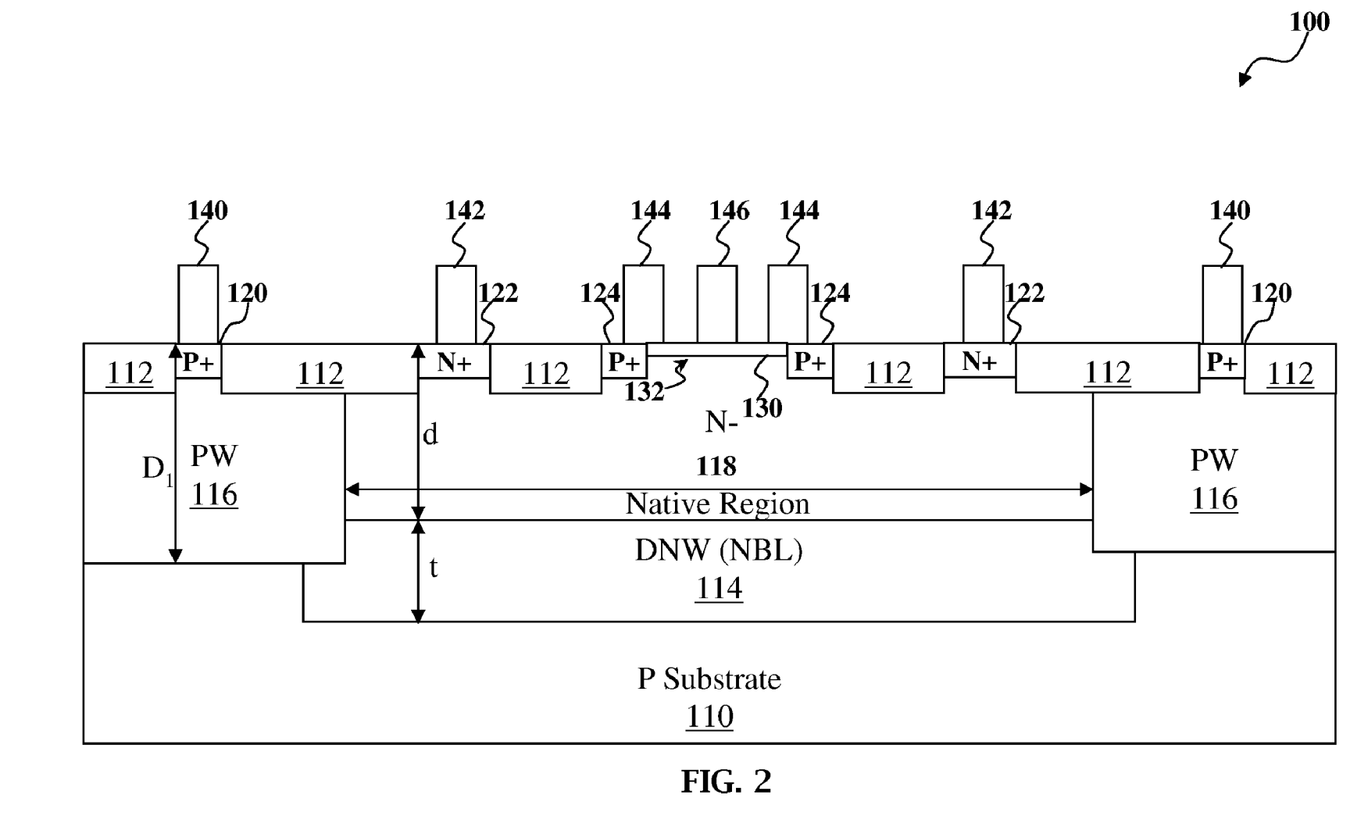
FIG. 2 is a diagrammatic sectional side view of the integrated circuit device taken along line 2-2 in FIG. 1.

FIG. 1 is a diagrammatic top view of an embodiment of an integrated circuit device 100 according to various aspects of the present disclosure, and FIG. 2 is a diagrammatic sectional side view of the integrated circuit device 100 taken along line 2-2 in FIG. 1. In the depicted embodiment, the integrated circuit device 100 is a Schottky diode. The integrated circuit device 100 may be an integrated circuit (IC) chip, system on chip (SoC), or portion thereof, that includes various passive and active microelectronic devices such as resistors, capacitors, inductors, diodes, metal-oxide semiconductor field effect transistors (MOSFET), complementary metal-oxide semiconductor (CMOS) transistors, high voltage transistors, high frequency transistors, oter suitable components, or combinations thereof. FIGS. 1 and 2 will be discussed concurrently and have been simplified for the sake of clarity to better understand the inventive concepts of the present disclosure. Additional features can be added in the integrated circuit device 100, and some of the features described below can be replaced or eliminated for other embodiments of the integrated circuit device 100.

The integrated circuit device 100 includes a substrate 110. In the depicted embodiment, the substrate 110 is a semiconductor substrate including silicon. Alternatively or additionally, the substrate 110 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 110 may be a semiconductor on insulator (SOI). The semiconductor substrate 110 may include a doped epi layer, a gradient semiconductor layer, and/or a semiconductor layer overlying another semiconductor layer of a different type, such as a silicon layer on a silicon germanium layer. In the depicted embodiment, the substrate 110 is a p-doped silicon substrate. P-type dopants that the substrate 110 are doped with include boron, gallium, indium, other suitable p-type dopants, or combinations thereof. Because the depicted integrated circuit device 100 includes a p-doped substrate, doping configurations described below should be read consistent with a p-doped substrate. The integrated circuit device 100 may alternatively include an n-doped substrate, in which case, the doping configurations described below should be read consistent with an n-doped substrate (for example, read with doping configurations having an opposite conductivity). N-type dopants that the substrate 110 can be doped with include phosphorus, arsenic, other suitable n-type dopants, or combinations thereof.

Isolation features 112 are formed in the substrate 110 to isolate various active (OD) regions of the substrate 110. The isolation features 112 may also isolate the integrated circuit device 100 from other devices (not shown). In the depicted embodiment, the isolation features 112 utilize shallow trench isolation (STI) technology to form STI features that define and electrically isolate the various regions. Alternatively, the isolation features 112 utilize another isolation technology, such as local oxidation of silicon (LOCOS). The isolation features 112 comprise silicon oxide, silicon nitride, silicon oxynitride, other suitable materials, or combinations thereof. The isolation features 112 are formed by a suitable process. As one example, forming a STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

The substrate 110 includes various doped regions. For example, in the depicted embodiment, the substrate 110 includes an n-type buried layer, i.e., a deep n-well (DNW) region 114. The DNW region 114 is implanted deeply within the substrate 110. For example, the DNW region 114 is implanted in the substrate 110 at a depth (d) from a top surface of the substrate 110. In the depicted embodiment, the DNW region 114 is at a depth of about 4 µm to about 6 µm. A thickness (t) of the DNW region 114 is about 0.5 µm to about 4 µm, and a doping concentration of the DNW region 114 is about $1 \times 10^{15}$ atoms/cm$^3$ to about $1 \times 10^{17}$ atoms/cm$^3$. The DNW region 114 is formed by implanting the substrate 110 with an n-type dopant, such as phosphorous or arsenic, and subjecting the DNW region 114 to an annealing process, such as a rapid thermal anneal or laser anneal. Alternatively, the DNW region 114 is formed by another suitable process, such as a diffusion process The substrate 110 also includes p-well (PW) regions 116. The PW regions 116 extend from the top surface of the substrate 110 a distance ($D_1$) into the substrate 110. In the depicted embodiment, the PW regions 116 extend a distance into the substrate 110 that is about equal to the depth of the DNW region 114, for example, about 4 µm to about 6 µm. The PW regions 116 are adjacent to the DNW region 114, and portions of the PW regions 116 abut the DNW region 114. The PW regions 116 are formed by implanting the substrate 110 with a p-type dopant, such as boron, and subjecting the PW regions 116 to an annealing process, such as a rapid thermal anneal or laser anneal. Alternatively, the PW regions 116 are formed by another suitable process, such as a diffusion process.

The substrate 110 includes a native (NTN) region. The native region is a region without p-well or n-well implants, and thus, is free of n-wells or p-wells. The native region is disposed above the DNW region 114 and between the PW regions 116, such that the DNW region 114 and PW regions 116 define a boundary of the native region. In the depicted embodiment, the native region includes a diffused region 118. The DNW region 114 defines a bottom of the diffused region 118, and the PW regions 116 define sidewalls of the diffused region 118. Put another way, the PW regions 116 define a perimeter of the diffused region 118. In the depicted embodiment, the diffused region 118 is lightly doped with an n-type dopant, forming lightly doped N— diffusion region 118. In the depicted embodiment, the lightly doped N— diffusion region has a doping concentration less than the DNW region 114. For example, the lightly doped N— diffusion region 118 means having a doping concentration of about $1 \times 10^{15}$ atoms/cm$^3$ to about $1 \times 10^{16}$ atoms/cm$^3$. One skilled in the art will recognize that the terms lightly doped and heavily doped are terms of art that describe a doping concentration of the region depending on the specific device type, technology generation, minimum feature size, and/or other factors. Accordingly, lightly doped and heavily doped should be interpreted in light of the technology being evaluated and not limited to the described embodiments herein. In the depicted embodiment, the lightly doped N— diffusion region 118 is formed when the DNW region 114 is subjected to the annealing process. For example, when the DNW region 114 is subjected to the annealing process, n-type dopants diffuse into the native region, thereby forming the lightly doped N— diffusion region 118. The DNW region 114 can thus alternatively be referred to as a diffusion source. Annealing processes performed on other doped regions and other features of the integrated circuit device 100 may also cause dopants from the DNW region 114 to diffuse into the native region, contributing to the forming of the lightly doped N-diffusion region.

Doped regions 120, 122, and 124 are also formed in the substrate 110. Doped regions 120 and 124 are heavily doped with a p-type dopant, such as boron, and doped regions 122 are heavily doped with an n-type dopant, such as phosphorus or arsenic. Accordingly, the doped regions 120 and 124 are referred to as P+ regions 120 and 124, and the doped regions 122 are referred to as N+ regions. The P+ regions 120 and 124 may have a same or different dopant type, doping concentration, and/or doping profile. Each of the doped regions 120, 122, and 124 is formed between isolation features 112, such that each of the doped regions 120, 122, and 124 is isolated from another doped region 120, 122, or 124 by the isolation features 112. P+ regions 120 are formed between isolation features 112 and in the PW regions 116, extending from the top surface of the substrate 110 into the PW regions 116. The P+ regions 120 surround the N+ regions 122 and P+ regions 124. The P+ regions 120 may be referred to as a P+ guard ring. N+ regions 122 are formed between isolation regions 112 and in the N— diffusion region 118, extending from the top surface of the substrate 110 into the N— diffusion region 118. P+ regions 124 are formed in the N-diffusion region 118 between a metal layer 130 and isolation feature 112, extending from the top surface of the substrate 110 into the N-diffusion region 118. The P+ regions 124 surround the metal layer 130, and may also be referred to as a guard ring.

The metal layer 130 is disposed over the substrate 110 between P+ regions 124, and is electrically coupled to the lightly doped N— diffusion region 118. A Schottky barrier forms at a junction 132 of the metal layer 130 and lightly doped N— diffusion region 118. In the depicted embodiment, the metal layer 130 is a metal silicide layer comprising, for example, titanium silicide (TiSi), cobalt silicide (CoSi), nickel silicide (NiSi), platinum silicide (PtSi), tantalum silicide (TaSi), other suitable metal silicide materials, or combinations thereof. The metal silicide layer may be formed by a salicide (self-aligned silicidation) process, which includes forming a metal layer (not shown) over the substrate, specifically over the lightly doped N— diffusion region 118 of the substrate 110 and performing an annealing process to cause a reaction between the metal layer and the underlying silicon. The annealing process utilizes an elevated temperature that is selected based on the composition of the metal layer. The unreacted metal layer is removed thereafter. Additional thermal processes may be implemented to reduce the resistance of the metal silicide. Alternatively, the metal layer 130 comprises other metal materials suitable for forming a Schottky barrier, such as tungsten, titanium, chromium, silver, palladium, other suitable metal materials, or combinations thereof.

The integrated circuit device 100 includes a contact structure that includes contacts 140, 142, 144, and 146. The contacts 140, 142, 144, and 146 include a conductive material, such as titanium (Ti), tungsten (W), tantalum (Ta), aluminum (Al), copper (Cu), other conductive material, or combinations thereof. In the depicted embodiment, the contacts 140, 142, 144, and 146 comprise a same size, shape, and material, but alternatively, the contacts 140, 142, 144, and 146 may differ in size, shape, and/or material depending on design requirements of the integrated circuit device 100. The contacts 140 are electrically coupled with the P+ regions 120, the contacts 142 are electrically coupled with the N+ regions 142, the contacts 144 are electrically coupled with the P+ regions 132 and metal layer 130, and the contact 146 is electrically coupled with the metal layer 130. The contacts 140, 142, 144, and 146 may be coupled with the various regions via silicide features, such as a metal silicide.

The contacts 140, 142, 144, and 146 are formed by a suitable process. For example, the contacts 140, 142, and 146 may be formed in a not-illustrated interlayer (or inter-level) dielectric (ILD) layer formed over the substrate 110. Forming the contacts 140, 142, 144, and 146 may include patterning and etching the ILD layer to form trenches, partially filling the trenches with a metal barrier layer, such as TiN, and then depositing a contact plug layer, such as W, on the metal barrier layer to fill the trenches. The ILD layer comprises a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), xerogel, aerogel, amorphous fluorinated carbon, parylene, BCB (bis-benzocyclobutenes), SiLK® (Dow Chemical, Midland, Mich.), polyimide, or combinations thereof. The ILD layer may alternatively have a multilayer structure having multiple dielectric materials.

The integrated circuit device 100 may include additional features. For example, various contacts/vias/lines and multilayer interconnect features (e.g., metal layers and interlayer dielectrics) may be formed over the substrate 110, configured to connect the various features or structures of the integrated circuit device 100. The additional features may provide electrical interconnection to the device 100. For example, the contacts 140, 142, 144, and 146 may be coupled with the multiplayer interconnect features. In an example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 3:
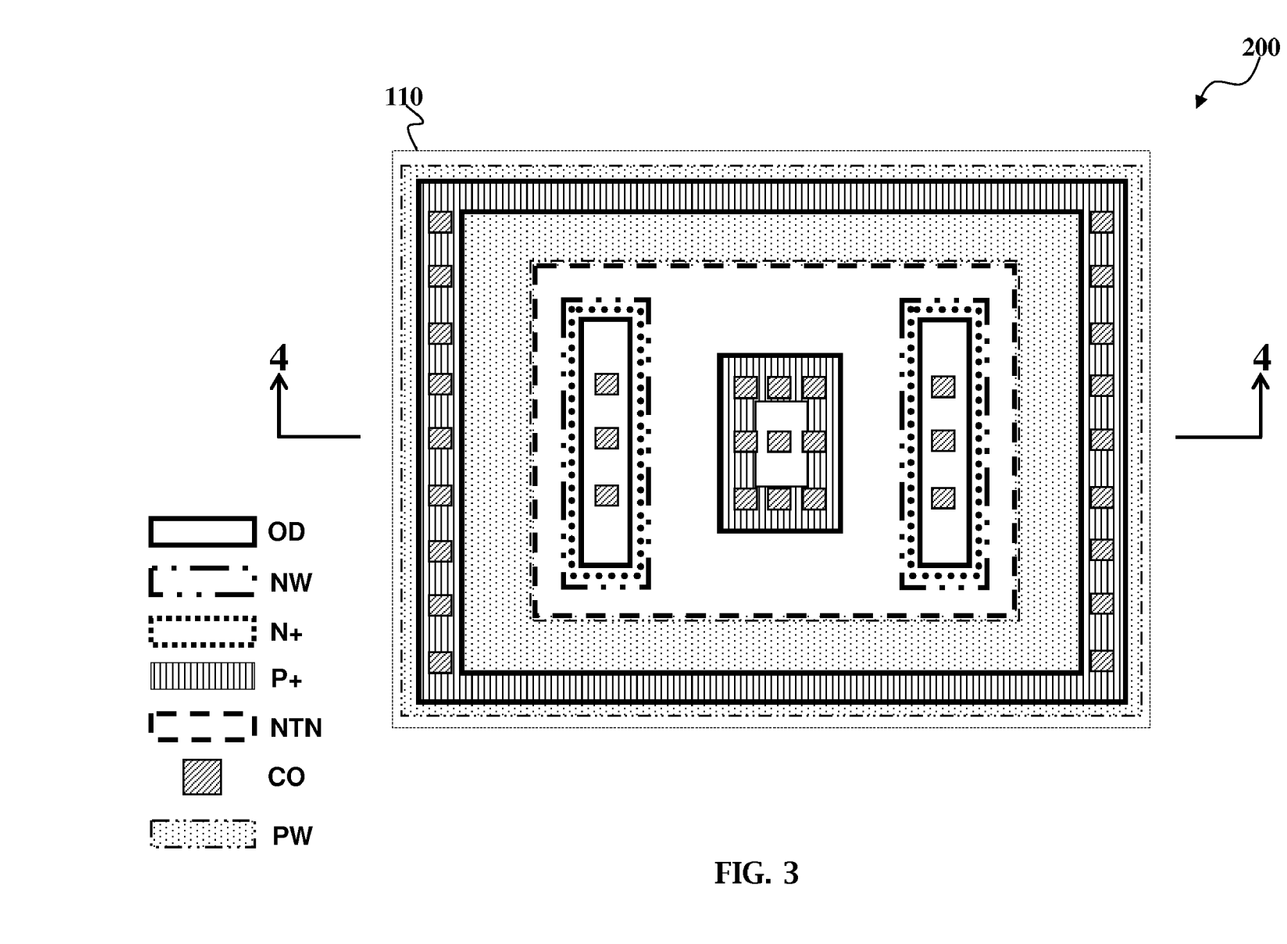
FIG. 3 is a diagrammatic top view of another embodiment of an integrated circuit device according to various aspects of the present disclosure.
Figure 4:
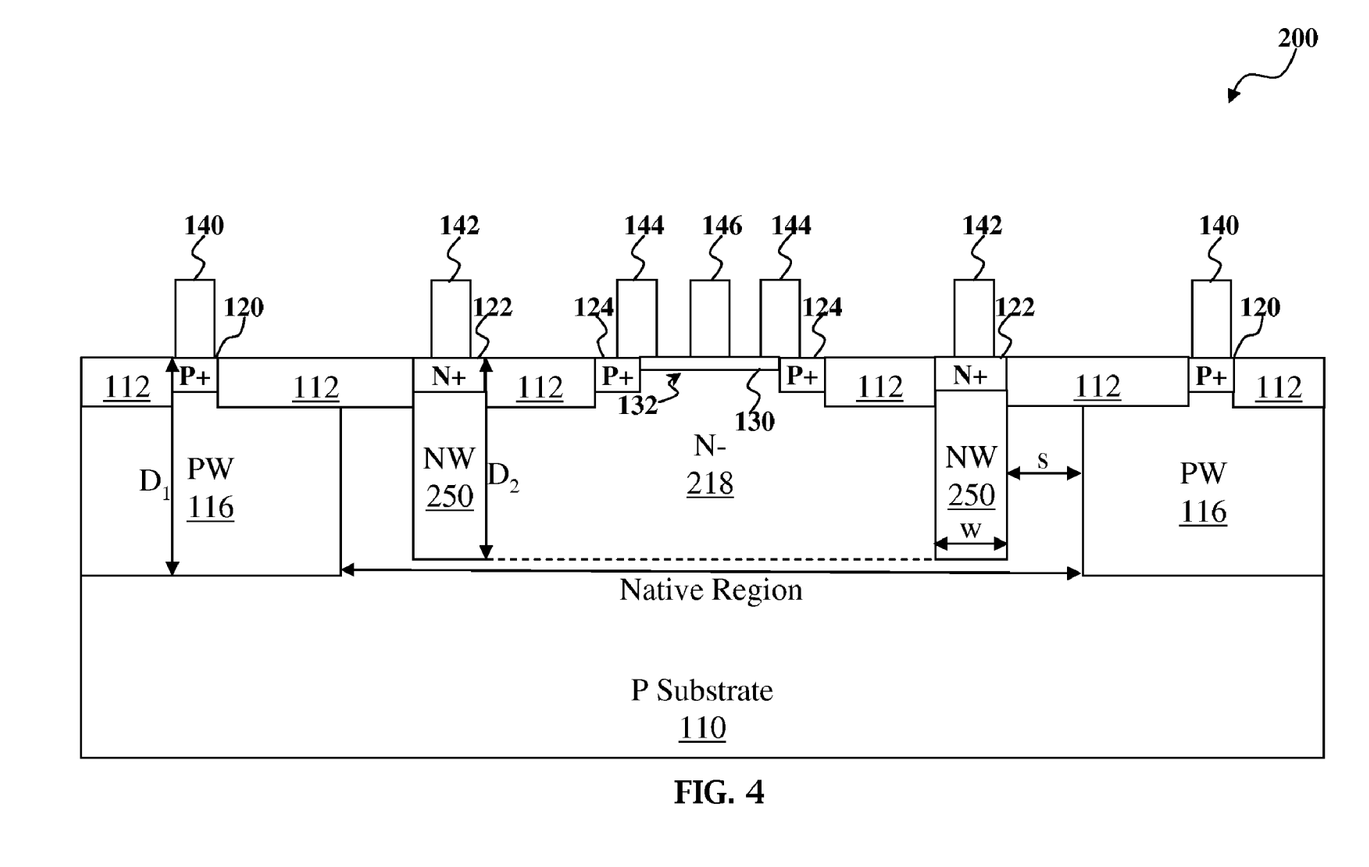
FIG. 4 is a diagrammatic sectional side view of the integrated circuit device taken along line 4-4 in FIG. 3.

FIG. 3 is a diagrammatic top view of an integrated circuit device 200 that is an alternative embodiment of the integrated circuit device 100 of FIGS. 1 and 2. FIG. 4 is a diagrammatic sectional side view of the integrated circuit device 200 taken along line 4-4 in FIG. 3. The embodiment of FIGS. 3 and 4 is similar in many respects to the embodiment of FIGS. 1 and 2. Accordingly, similar features in FIGS. 1-2 and 3-4 are identified by the same reference numerals for clarity and simplicity. FIGS. 3 and 4 will be discussed concurrently and have been simplified for the sake of clarity to better understand the inventive concepts of the present disclosure. Accordingly, additional features can be added in the integrated circuit device 200, and some of the features described below can be replaced or eliminated for other embodiments of the integrated circuit device 200.

The integrated circuit device 200 is a Schottky diode. The integrated circuit device 200 does not include the DNW region 114 as a diffusion source for the native region. Instead, the integrated circuit device 200 includes n-well (NW) regions 250 as a diffusion source. The NW regions 250 extend from the top surface of the substrate 110 a distance ($D_2$) into the substrate 110. In the depicted embodiment, the NW regions 250 extend from doped regions 122. The NW regions 250 extend a distance into the substrate 110 that is about the distance the PW regions 116 extend into the substrate 110, for example, about 4 μm to about 6 μm. The NW regions 250 are laterally spaced a distance, s, from the PW regions 116. In the depicted embodiment, a width (w) of the NW regions 250 is about 0.5 μm to about 3 μm, and a doping concentration of the NW regions 250 is about $1 \times 10^{16}$ atoms/cm$^3$ to about $1 \times 10^{18}$ atoms/cm$^3$. The NW regions 250 are formed by implanting the substrate 110 with an n-type dopant, such as phosphorous or arsenic. In the depicted embodiment, the NW regions 250 are subjected to an annealing process, such as a rapid thermal anneal or laser anneal. Alternatively, the NW regions 250 are formed by another suitable process, such as a diffusion process.

Similar to the integrated circuit device 100 in FIGS. 1 and 2, the native (NTN) region is disposed between the PW regions 116, which define the boundary of the native region. In the depicted embodiment, a diffused region 218 is disposed in the native region between the NW regions 250. The NW regions 250 are adjacent to the diffused region 218. In the depicted embodiment, the diffused region 218 is lightly doped with an n-type dopant, forming lightly doped N— diffusion region 218. The lightly doped N— diffusion region has a doping concentration less than the NW regions 250. For example, the lightly doped N— diffusion region 218 means having a doping concentration of about $1 \times 10^{15}$ atoms/cm$^3$ to about $1 \times 10^{16}$ atoms/cm$^3$. One skilled in the art will recognize that the terms lightly doped and heavily doped are terms of art that describe a doping concentration of the region depending on the specific device type, technology generation, minimum feature size, and/or other factors. Accordingly, lightly doped and heavily doped should be interpreted in light of the technology being evaluated and not limited to the described embodiments herein. In the depicted embodiment, the lightly doped N— diffusion region 218 is formed when the NW regions 250 are subjected to the annealing process. For example, when the NW regions 250 are subjected to the annealing process, n-type dopants diffuse into the native region, specifically between the NW regions 250, thereby forming the lightly doped N— diffusion region 218. Annealing processes performed on other doped regions and other features of the integrated circuit device 200 may also cause dopants from the NW regions 250 to diffuse into the native region, contributing to the forming of the lightly doped N— diffusion region.

Figure 5:
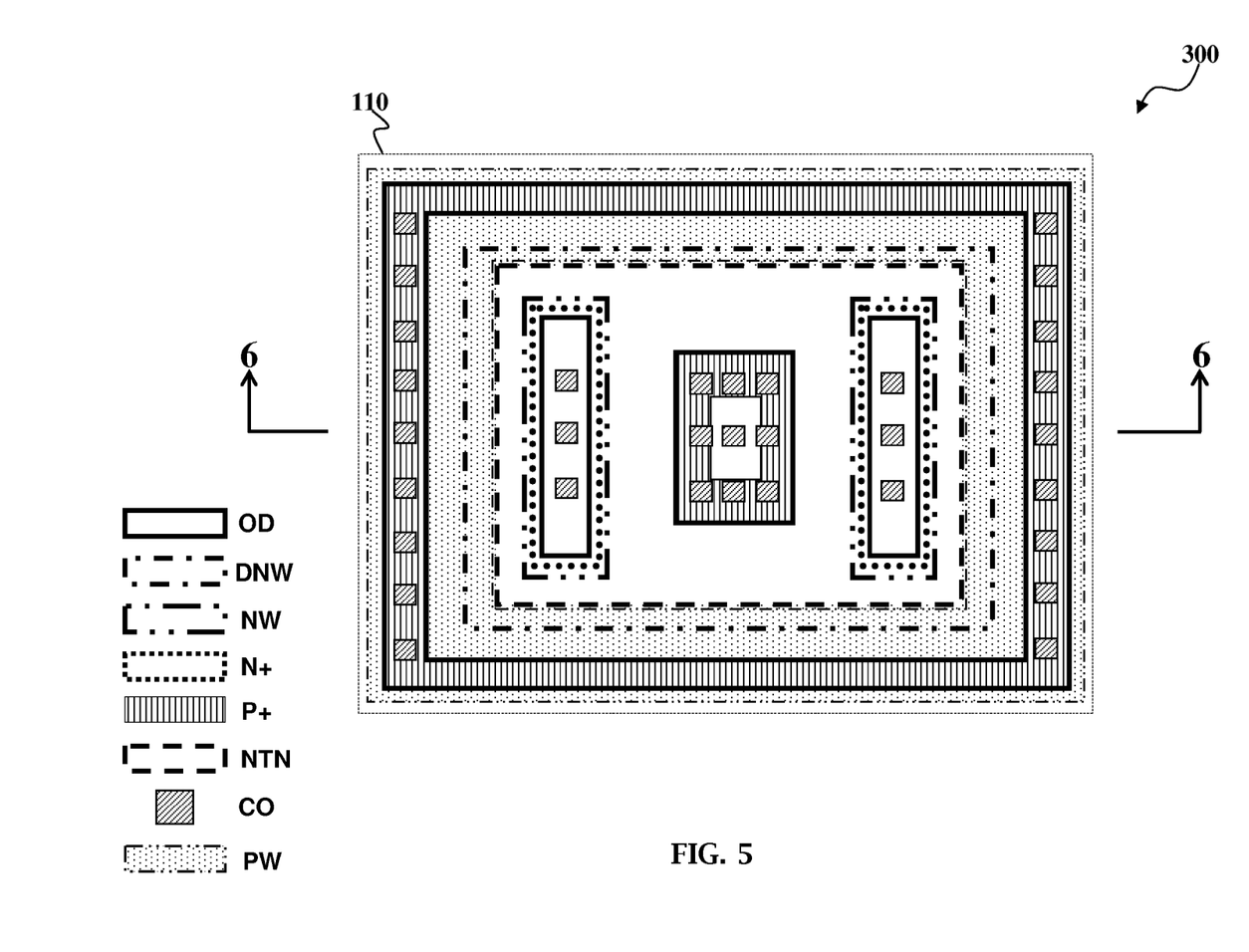
FIG. 5 is a diagrammatic top view of yet another embodiment of an integrated circuit device according to various aspects of the present disclosure.
Figure 6:
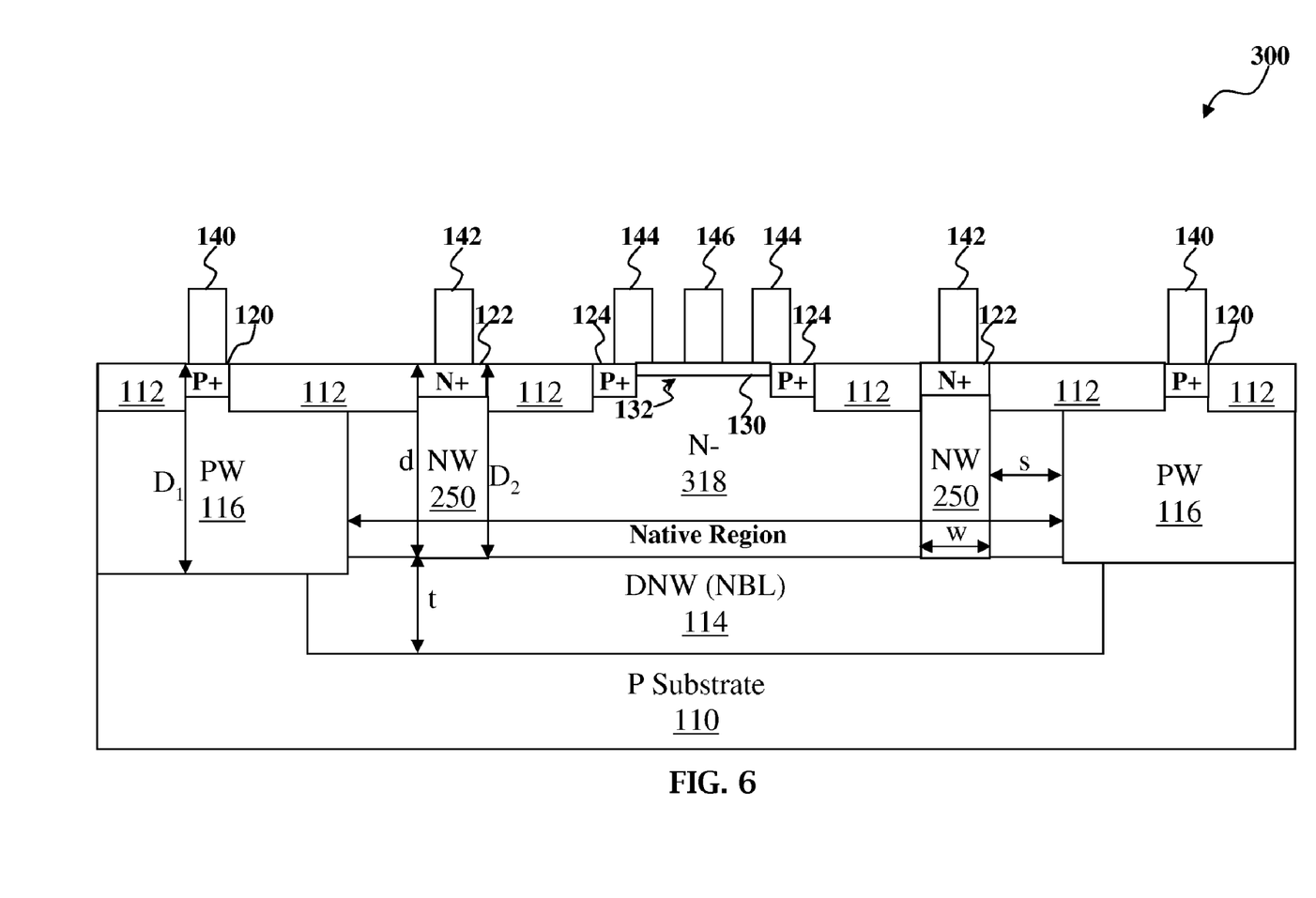
FIG. 6 is a diagrammatic sectional side view of the integrated circuit device taken along line 6-6 in FIG. 5.

FIG. 5 is a diagrammatic top view of an integrated circuit device 300 that is another alternative embodiment of the integrated circuit device 100 of FIGS. 1 and 2. FIG. 6 is a diagrammatic sectional side view of the integrated circuit device 300 taken along line 6-6 in FIG. 5. The embodiment of FIGS. 5 and 6 is similar in many respects to the embodiments of FIGS. 1-4. Accordingly, similar features in FIGS. 1-4 and 5-6 are identified by the same reference numerals for clarity and simplicity. FIGS. 5 and 6 will be discussed concurrently and have been simplified for the sake of clarity to better understand the inventive concepts of the present disclosure. Accordingly, additional features can be added in the integrated circuit device 300, and some of the features described below can be replaced or eliminated for other embodiments of the integrated circuit device 300.

The integrated circuit device 300 is a Schottky diode. The integrated circuit device 300 includes both the DNW region 114 and the NW regions 250, which both provide a diffusion source for the native region. In the depicted embodiment, the NW regions 250 extend a distance into the substrate 110 that is about the depth (d) of the DNW region 114, for example, about 4 µm to about 6 µm. The NW regions 250 are laterally spaced a distance, s, from the PW regions 116. Further, in the depicted embodiment, the doping concentration of the NW regions 250 is about an order higher than the DNW region 114. For example, a doping concentration of the DNW region 114 is about $1 \times 10^{15}$ atoms/cm$^3$ to about $1 \times 10^{17}$ atoms/cm$^3$, and a doping concentration of the NW regions 250 is about $1 \times 10^{16}$ atoms/cm$^3$ to about $1 \times 10^{18}$ atoms/cm$^3$. As noted above, the DNW region 114 and NW regions 250 are formed by implanting the substrate 110 with an n-type dopant, such as phosphorous or arsenic. In the depicted embodiment, the DNW region 114 and NW regions 250 are subjected to an annealing process, such as a rapid thermal anneal or laser anneal. Alternatively, the DNW region 114 and NW regions 250 are formed by another suitable process, such as a diffusion process.

Similar to the integrated circuit device 100 in FIGS. 1-2 and the integrated circuit device 200 in FIGS. 3-4, the native (NTN) region is disposed above the DNW region 114 and between the PW regions 116, such that the DNW region 114 and PW regions 116 define a boundary of the native region. In the depicted embodiment, the native region includes a diffused region 318. The DNW region 114 defines a bottom of the diffused region 318, and the NW regions 250 define sidewalls of the diffused region 318. In the depicted embodiment, the diffused region 318 is lightly doped with an n-type dopant, forming lightly doped N— diffusion region 318. Further, in the depicted embodiment, and the lightly doped N— diffusion region 318 has a doping concentration less than the NW regions 250 and DNW region 114. For example, the lightly doped N— diffusion region 318 means having a doping concentration of about $1 \times 10^{15}$ atoms/cm$^3$ to about $1 \times 10^{16}$ atoms/cm$^3$. One skilled in the art will recognize that the terms lightly doped and heavily doped are terms of art that describe a doping concentration of the region depending on the specific device type, technology generation, minimum feature size, and/or other factors. Accordingly, lightly doped and heavily doped should be interpreted in light of the technology being evaluated and not limited to the described embodiments herein. In the depicted embodiment, the lightly doped N— diffusion region 318 is formed when the DNW region 114 and NW regions 250 are subjected to the annealing processes. For example, when the DNW region 114 and NW regions 250 are subjected to the annealing processes, n-type dopants diffuse into the native region, specifically between the NW regions 250, thereby forming the lightly doped N— diffusion region 318. Annealing processes performed on other doped regions and other features of the integrated circuit device 300 may also cause dopants from the DNW region 214 and NW regions 250 to diffuse into the native region, contributing to the forming of the lightly doped N-diffusion region.

Figure 7:
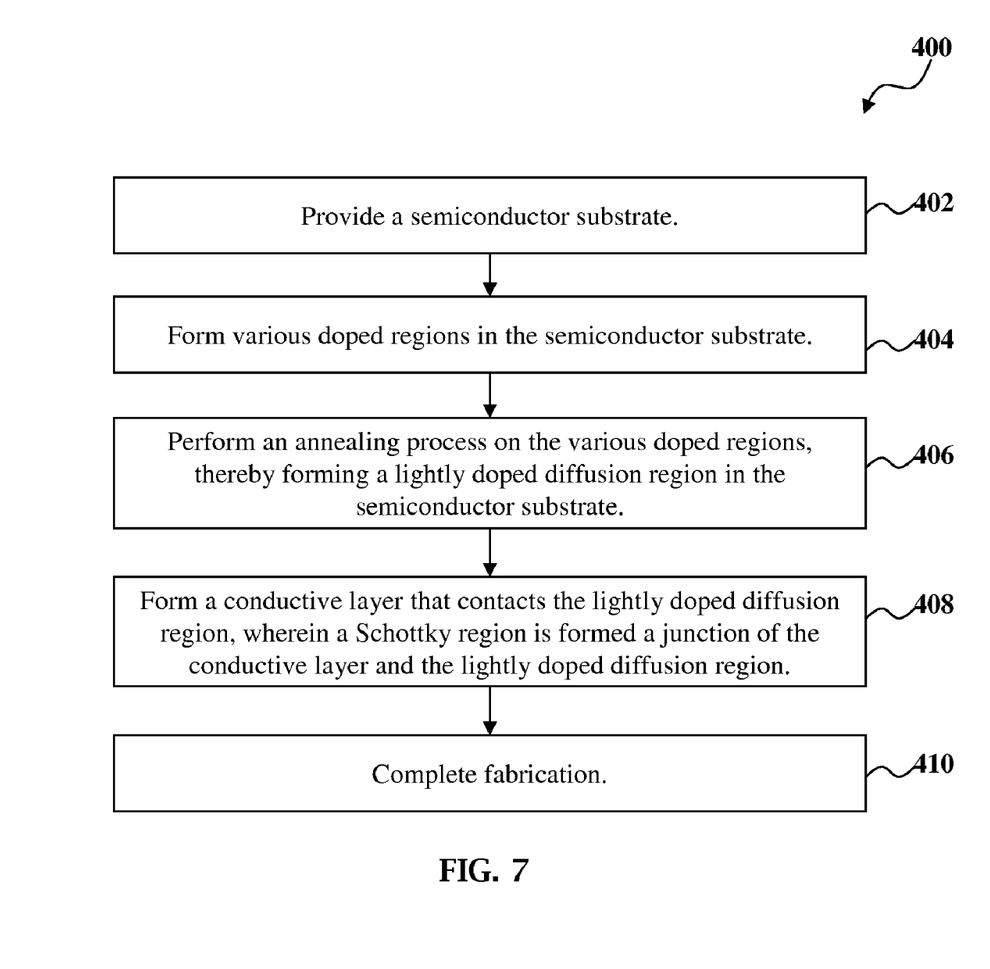
FIG. 7 is a flow chart of a method for fabricating an integrated circuit device according to various aspects of the present disclosure.

FIG. 7 is a flow chart of a method 400 for fabricating an integrated circuit device according to various aspects of the present disclosure. The method 400 begins at block 402 where a semiconductor substrate is provided. At block 404, various doped regions are formed in the semiconductor substrate. At block 406, an annealing process is performed on the various doped regions, thereby forming a lightly doped diffusion region in the semiconductor substrate. At block 408, a conductive layer is formed that contacts the lightly doped diffusion region. A junction of the conductive layer and the lightly doped diffusion region forms a Schottky region. At block 410, fabrication of the integrated circuit device is completed. Additional steps can be provided before, during, and after the method 400, and some of the steps described can be replaced or eliminated for other embodiments of the method.

The method 400 can be implemented to fabricate the integrated circuit device 100 described above. For example, referring to FIGS. 1 and 2, at block 402, the substrate 110 is provided. At block 404, the DNW region 114 is formed by implanting n-dopants, such as phosphorous or arsenic, at the depth (d) in the substrate 110. After forming the DNW region 114, the PW regions 116 are formed by implanting the substrate 110 with p-type dopants, such as boron. In the depicted embodiment, the doped regions 120, 122, and 124 are formed by a diffusion process. The isolation features 112 may be formed at any time to isolate the various features of the integrated circuit device 100. For example, the isolation features 112 are formed after the DNW region 114 and PW regions 116, but before the doped regions 120, 122, and 124. At block 406, an annealing process is performed and n-type dopants from the DNW region 114 diffuse into a native region of the substrate 110 to form the lightly doped N— diffused region 118. In the depicted embodiment, the annealing process is a thermal annealing process at a temperature of about 850° C. to about 1,100° C. for a time of about 30 minutes to about an hour. Other temperatures and times may be used to achieve particular characteristics of the lightly doped N— diffusion region 118. As noted above, annealing processes performed on the other doped regions, such as the PW regions 116 and doped regions 120, 122, and 124, may also cause dopants from the DNW region 114 to diffuse into the native region, contributing to forming the lightly doped N— diffused region 118. Accordingly, the annealing processes to form the integrated circuit device 100 are tuned (for example, temperature and time of each of the annealing processes) to ensure that the lightly doped N— diffused region 118 in the completed integrated circuit device 100 exhibits the desired doping concentration, doping profile, and/or electrical characteristics. At block 408, the metal layer 130 is formed, providing a Schottky barrier at junction 132 of the metal layer 130 and lightly doped N— diffusion region 118. At block 410, fabrication of the integrated circuit device 100 is completed. For example, an interconnection structure including various metal and dielectric layer may be formed over the substrate 110. For example, in the depicted embodiment, the various contacts 140, 142, 144, and 146 are formed in a dielectric layer (not illustrated) over the substrate 110, and coupled with various features of the integrated circuit device 100.

The method 400 can also be implemented to fabricate the integrated circuit device 200 described above. For example, referring to FIGS. 3 and 4, at block 402, the substrate 110 is provided. At block 404, the PW regions 116 are formed by implanting the substrate 110 with p-type dopants, such as boron. The NW regions 250 are formed by implanting the substrate 110 with n-type dopants. In the depicted embodiment, the doped regions 120, 122, and 124 are formed by a diffusion process. The isolation features 112 may be formed at any time to isolate the various features of the integrated circuit device 200. For example, the isolation features 112 are formed after the PW regions 116 and NW regions 250, but before the doped regions 120, 122, and 124. At block 406, an annealing process is performed, and n-type dopants from the NW regions 250 diffuse into a native region of the substrate 110 to form the lightly doped N— diffused region 218. In the depicted embodiment, the annealing process is a thermal annealing process at a temperature of about 850° C. to about 1,100° C. for a time of about 30 minutes to about an hour. Other temperatures and times may be used to achieve particular characteristics of the lightly doped N— diffusion region 218. It should be noted that annealing processes performed on the other doped regions, such as the PW regions 116 and doped regions 120, 122, and 124, may also cause dopants from the NW regions 250 to diffuse into the native region to form the lightly doped N— diffused region 218. Accordingly, the annealing processes to form the integrated circuit device 200 are tuned (for example, temperature and time of each of the annealing processes) to ensure that the lightly doped N— diffused region 218 in the completed integrated circuit device 200 exhibits the desired doping concentration, doping profile, and/or electrical characteristics. At block 408, the metal layer 130 is formed, providing a Schottky barrier at junction 132 of the metal layer 130 and lightly doped N— diffusion region 218. At block 410, fabrication of the integrated circuit device 200 is completed. For example, an interconnection structure including various metal and dielectric layer may be formed over the substrate 110. For example, in the depicted embodiment, the various contacts 140, 142, 144, and 146 are formed in a dielectric layer (not illustrated) over the substrate 110, and coupled with various features of the integrated circuit device 200.

The method 400 can also be implemented to fabricate the integrated circuit device 300 described above. For example, referring to FIGS. 5 and 6, at block 402, the substrate 110 is provided. At block 404, the DNW region 114 is formed by implanting n-dopants, such as phosphorous or arsenic, at the depth (d) in the substrate 110. After forming the DNW region 114, the PW regions 116 are formed by implanting the substrate 110 with p-type dopants, such as boron, and the NW regions 250 are formed by implanting the substrate 110 with n-type dopants. In the depicted embodiment, the doped regions 120, 122, and 124 are formed by a diffusion process. The isolation features 112 may be formed at any time to isolate the various features of the integrated circuit device 200. For example, the isolation features 112 are formed after the DNW region 114, PW regions 116, and NW regions 250, but before the doped regions 120, 122, and 124. At block 406, an annealing process is performed, and n-type dopants from the DNW region 114 and NW regions 250 diffuse into a native region of the substrate 110 to form the lightly doped N— diffused region 318. In the depicted embodiment, the annealing process is a thermal annealing process at a temperature of about 850° C. to about 1,100° C. for a time of about 30 minutes to about an hour. Other temperatures and times may be used to achieve particular characteristics of the lightly doped N— diffusion region 318. It should be noted that annealing processes performed on the other doped regions, such as the PW regions 116 and doped regions 120, 122, and 124, may also cause dopants from the DNW region 214 and NW regions 250 to diffuse into the native region to form the lightly doped N— diffused region 318. Accordingly, the annealing processes to form the integrated circuit device 300 are tuned (for example, temperature and time of each of the annealing processes) to ensure that the lightly doped N— diffused region 318 in the completed integrated circuit device 300 exhibits the desired doping concentration, doping profile, and/or electrical characteristics. At block 408, the metal layer 130 is formed, providing a Schottky barrier at junction 132 of the metal layer 130 and lightly doped N— diffusion region 218. At block 410, fabrication of the integrated circuit device 300 is completed. For example, an interconnection structure including various metal and dielectric layer may be formed over the substrate 110. For example, in the depicted embodiment, the various contacts 140, 142, 144, and 146 are formed in a dielectric layer (not illustrated) over the substrate 110, and coupled with various features of the integrated circuit device 300.

The foregoing description discloses Schottky devices that exhibit improved performance by implementing a conductive layer in contact with a lightly doped diffusion region (such as the lightly doped N— diffusion regions 118, 218, and/or 318 described above) to form a Schottky barrier. The lightly doped diffusion region reduces a doping concentration at a junction of the conductive layer/lightly doped diffusion region, leading to increased breakdown voltages ($V_{BD}$) and decreased leakage current of the disclosed Schottky devices. The wells of the same conductivity type adjacent to the lightly doped diffusion regions (for example, NW regions 250) can reduce parasitic resistance exhibited by the Schottky devices. Further, the Schottky devices disclosed above (integrated circuit device 100, 200, and/or 300) are easily formed on a same wafer using standard CMOS processes without implementing extra processing (such as extra masking steps) and/or costs. This allows Schottky devices having varying breakdown voltages and turn on voltages to be easily manufactured on a single integrated circuit device. Different embodiments may have different advantages, and no particular advantage is necessarily required of any one embodiment.

The present disclosure provides for many different embodiments. In an example, an integrated circuit device includes a semiconductor substrate having a top surface and a bottom surface; a lightly doped diffusion region disposed in the semiconductor substrate; a first well extending from the top surface into the semiconductor substrate, the first well surrounding the lightly doped diffusion region; a second well disposed in the semiconductor substrate, the second well disposed below the lightly doped diffusion region and partially abutting a bottom portion of the first well; and a conductive layer disposed adjacent to the lightly doped diffusion region, wherein a Schottky region is formed at a junction of the conductive layer and the lightly doped diffusion region. The semiconductor substrate and the first well are a first conductivity type. The lightly doped diffusion region and second well are a second conductivity type. A doping concentration of the lightly doped diffusion region may be less than a doping concentration of the second well. The integrated circuit device can further include a third well of the second conductivity type extending from the top surface into the semiconductor substrate to the second well, wherein the third well defines sidewalls of the lightly doped diffusion region. In an example, the lightly doped diffusion region is a lightly doped N— region, the first well is a deep n-well (DNW), and the second well is a p-well (PW).

The integrated circuit device can further include a first doped region of the first conductivity type disposed in the lightly doped diffusion region and adjacent to the top surface of the substrate, the first doped region surrounding the conductive layer. An isolation feature may be disposed in the substrate between the first doped region and a second doped region of the second conductivity type, the second doped region being disposed in the lightly doped diffusion region and adjacent to the top surface of the substrate. The integrated circuit device may further include a third doped region of the first conductivity type disposed in the first well and adjacent to the top surface of the substrate. Another isolation feature may be disposed in the substrate between the second and third doped regions. In an example, the first, second, and third doped regions are heavily doped diffusion regions. A contact structure may be coupled with the conductive layer, first doped region, second doped region, and third doped region.

In another example, an integrated circuit device includes a semiconductor substrate having a top surface and a bottom surface; a lightly doped diffusion region disposed in the substrate; a first well and a second well extending from the top surface into the semiconductor substrate, the lightly doped diffusion region being disposed between the first and second wells; a third well extending from the top surface into the semiconductor substrate, the third well surrounding the first and second wells; and a conductive layer disposed adjacent to the lightly doped diffusion region, wherein a Schottky region is formed at a junction of the conductive layer and the lightly doped diffusion region. The semiconductor substrate and the third well are a first conductivity type. The lightly doped diffusion region, first well, and second well are a second conductivity type. The integrated circuit device can further include a fourth well of the second conductivity type disposed in the semiconductor substrate below the lightly doped diffusion region and partially abutting a bottom portion of the third well. The first and second wells may extend from the top surface of the semiconductor substrate to the fourth well. The integrated third well may be laterally spaced a distance from the first and second wells.

The first and second wells may have a doping concentration of at least an order higher than the fourth well. For example, the first and second wells may have a doping concentration of about $1 \times 10^{16}$ atoms/cm$^3$ to about $1 \times 10^{18}$ atoms/cm$^3$, the fourth well has a doping concentration of about $1 \times 10^{15}$ atoms/cm$^3$ to about $1 \times 10^{17}$ atoms/cm$^3$, and the lightly doped diffusion region has a doping concentration of about $1 \times 10^{15}$ atoms/cm$^3$ to about $1 \times 10^{16}$ atoms/cm$^3$. In an example, the lightly doped diffusion region is a lightly doped N— region, the first and second wells are n-wells (NW), the third well is a p-well (PW), and the fourth well is a deep n-well (DNW).

The integrated circuit device may further include a first doped region disposed in the lightly doped diffusion region and adjacent to the top surface of the substrate, the first doped region surrounding the conductive layer; a second doped disposed in the first and second wells and adjacent to the top surface of the substrate, the second doped region having a first portion surrounded by the first well and a second portion surrounded by the second well; and a third doped region disposed in the third well and adjacent to the top surface of the substrate. The first and third doped regions may be the first conductivity type, and the second doped region may be the second conductivity type. An isolation feature may be disposed between the first and second doped regions, and an isolation feature disposed between the second and third doped regions.

In yet another example, a method includes providing a semiconductor substrate having a top surface and a bottom surface, the semiconductor substrate being a first conductivity type; forming a first well and a second well of a second conductivity type extending from the top surface into the semiconductor substrate; forming a third well of the first conductivity type extending from the top surface into the semiconductor substrate, the third well surrounding the first and second wells; performing an annealing process to form a lightly doped diffusion region disposed in the semiconductor substrate between the first and second wells, the lightly doped diffusion region being doped with the second conductivity type; and forming a conductive layer adjacent to the lightly doped diffusion region, wherein a junction of the conductive layer and the lightly doped diffusion region forms a Schottky region. The annealing process may be tuned so that dopants diffuse from the first and second wells to form the lightly doped diffusion region. In an example, the method may further include forming a fourth well of the second conductivity type disposed in the semiconductor substrate and partially abutting a bottom portion of the third well, wherein the first and second wells extend from the top surface of the semiconductor substrate to the fourth well, and wherein the lightly doped diffusion region is disposed above the fourth well. In this example, the annealing process may be tuned so that dopants diffuse from the first, second, and fourth wells to form the lightly doped diffusion region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
a semiconductor substrate having a top surface and a bottom surface, the semiconductor substrate being a first conductivity type;
a lightly doped diffusion region disposed in the semiconductor substrate, the lightly doped diffusion region being doped with a second conductivity type, the second conductivity type being different than the first conductivity type;
a first well of the first conductivity type extending from the top surface into the semiconductor substrate, the first well surrounding the lightly doped diffusion region;
a second well of the second conductivity type disposed in the semiconductor substrate, the second well disposed below the lightly doped diffusion region and partially abutting a bottom portion of the first well;
a third well of the second conductivity type adjacent to and in physical contact with the lightly doped diffusion region; and
a conductive layer disposed adjacent to the lightly doped diffusion region, wherein a Schottky region is formed at a junction of the conductive layer and the lightly doped diffusion region.

2. The integrated circuit device of claim 1 wherein a doping concentration of the lightly doped diffusion region is less than a doping concentration of the second well.

3. The integrated circuit device of claim 1 further including a first doped region of the first conductivity type disposed in the lightly doped diffusion region and adjacent to the top surface of the substrate, the first doped region surrounding the conductive layer.

4. The integrated circuit device of claim 1 wherein:
the lightly doped diffusion region is a lightly doped N— region;
the first well is a deep n-well (DNW); and
the second well is a p-well (PW).

5. The integrated circuit device of claim 1 wherein the third well of the second conductivity type extends from the top surface into the semiconductor substrate to the second well, wherein the third well defines a sidewall of the lightly doped diffusion region.

6. The integrated circuit device of claim 1 wherein the first well is laterally spaced a distance from the third well.

7. The integrated circuit device of claim 3 further including an isolation feature disposed in the substrate between the first doped region and a second doped region of the second conductivity type, the second doped region being disposed in the lightly doped diffusion region and adjacent to the top surface of the substrate.

8. The integrated circuit device of claim 7 further including a third doped region of the first conductivity type disposed in the first well and adjacent to the top surface of the substrate.

9. The integrated circuit device of claim 8 wherein another isolation feature is disposed in the substrate between the second and third doped regions.

10. The integrated circuit device of claim 8 wherein the first, second, and third doped regions are heavily doped diffusion regions.

11. The integrated circuit device of claim 8 further including a contact structure coupled with the conductive layer, first doped region, second doped region, and third doped region.

12. An integrated circuit device comprising:
a semiconductor substrate having a top surface and a bottom surface, the semiconductor substrate being a first conductivity type;
a lightly doped diffusion region disposed in the substrate, the lightly doped diffusion region being doped with a second conductivity type;
a first well and a second well of the second conductivity type extending from the top surface into the semiconductor substrate, the lightly doped diffusion region being disposed between the first and second wells;
a third well of the first conductivity type extending from the top surface into the semiconductor substrate, the third well surrounding the first and second wells, wherein the third well is laterally spaced a distance from the first and second wells; and
a conductive layer disposed adjacent to the lightly doped diffusion region, wherein a Schottky region is formed at a junction of the conductive layer and the lightly doped diffusion region.

13. The integrated circuit device of claim 12 further including a fourth well of the second conductivity type disposed in the semiconductor substrate below the lightly doped diffusion region and partially abutting a bottom portion of the third well, wherein the first and second wells extend from the top surface of the semiconductor substrate to the fourth well.

14. The integrated circuit device of claim 12 further including:
a first doped region of the first conductivity type disposed in the lightly doped diffusion region and adjacent to the top surface of the substrate, the first doped region surrounding the conductive layer;
a second doped region of the second conductivity type disposed in the first and second wells and adjacent to the top surface of the substrate, the second doped region having a first portion surrounded by the first well and a second portion surrounded by the second well; and
a third doped region of the first conductivity type disposed in the third well and adjacent to the top surface of the substrate.

15. The integrated circuit device of claim 13 wherein:
the lightly doped diffusion region is a lightly doped N— region;
the first and second wells are n-wells (NW);
the third well is a p-well (PW); and
the fourth well is a deep n-well (DNW).

16. The integrated circuit device of claim 13 wherein the first and second wells have a doping concentration of at least an order higher than the fourth well.

17. The integrated circuit device of claim 14 further including:
an isolation feature disposed between the first and second doped regions; and
an isolation feature disposed between the second and third doped regions.

18. The integrated circuit device of claim 16 wherein:
the first and second wells have a doping concentration of about $1\times10^{16}$ atoms/cm$^3$ to about $1\times10^{18}$ atoms/cm$^3$;
the fourth well has a doping concentration of about $1\times10^{15}$ atoms/cm$^3$ to about $1\times10^{17}$ atoms/cm$^3$; and
the lightly doped diffusion region has a doping concentration of about $1\times10^{15}$ atoms/cm$^3$ to about $1\times10^{16}$ atoms/cm$^3$.

19. A method comprising:
providing a semiconductor substrate having a top surface and a bottom surface, the semiconductor substrate being a first conductivity type;
forming a first well and a second well of a second conductivity type extending from the top surface into the semiconductor substrate, the second conductivity type being different than the first conductivity type;
forming a third well of the first conductivity type extending from the top surface into the semiconductor substrate, the third well surrounding the first and second wells and being laterally spaced a distance from the first and second wells;
performing an annealing process to form a lightly doped diffusion region disposed in the semiconductor substrate between the first and second wells, the lightly doped diffusion region being doped with the second conductivity type; and
forming a conductive layer adjacent to the lightly doped diffusion region, wherein a junction of the conductive layer and the lightly doped diffusion region forms a Schottky region.

20. The method of claim 19 wherein the performing the annealing process includes tuning the annealing process so that dopants diffuse from the first and second wells to form the lightly doped diffusion region.

* * * * *